US006426813B1

(12) United States Patent
Swenson et al.

(10) Patent No.: US 6,426,813 B1
(45) Date of Patent: Jul. 30, 2002

(54) TELEMETRY SYSTEM AND METHOD FOR EMI SUSCEPTIBILITY TESTING OF MOTOR VEHICLES

(75) Inventors: Eric T. Swenson; Steven P. Miller, both of Fort Wayne; Bruce E. Thomason, Columbus; Henry G. Gilbert, Fort Wayne, all of IN (US)

(73) Assignees: International Truck International Property Company, L.L.C., Warrenville, IL (US); CyberMetrix, Inc., Columbus, IN (US)

( * ) Notice: Subject to any disclaimer, the term of this patent is extended or adjusted under 35 U.S.C. 154(b) by 0 days.

(21) Appl. No.: 09/518,857

(22) Filed: Mar. 3, 2000

Related U.S. Application Data
(60) Provisional application No. 60/122,991, filed on Mar. 5, 1999.

(51) Int. Cl.[7] .......................... H04B 10/00; H04B 10/12; H04B 10/08
(52) U.S. Cl. .......................... 359/110; 324/628; 324/627
(58) Field of Search ................................ 359/110, 145; 324/201, 503, 627, 628

(56) References Cited

U.S. PATENT DOCUMENTS
| | | | |
|---|---|---|---|
| 4,939,446 A | | 7/1990 | Rogers |
| 5,311,116 A | * | 5/1994 | Rogers .................. 324/72.5 |
| 5,701,082 A | * | 12/1997 | Rogers .................. 324/628 |

OTHER PUBLICATIONS
Bronaugh, E.L., Osburn, J.D.M. Whole–Vehicle Radiated EMI Immunity Tests in Automotive EMC: Establishing and Calibrating the Test Field, Eighth International Conference on Electro–Magnetic Compatibility, Jan. 1, 1992, pp. 39–42, XP002144244.

Sperling D, Korber B, Reflection Measurements for EMC Prediction in Vehicle Electronics, Microwave and Millimeter Wave Technology Proceedings, ICMMT 98, Jan. 1, 1998, pp. 1072–1075, XP002144245.

Surface Vehicle Recommended Practice, Serial Data Communications Between Microcomputer Systems in Heavy–Duty Vehicle Applications, Society of Automotive Engineers, Inc., SAEJ1708, Rev. Oct. 93.

Surface Vehicle Recommended Practice, Data Link Layer, Society of Automotive Engineers Inc., SAEJ1939–21, Issued Jul. 94.

Surface Vehicle Recommended Practice, Physical Layer–250K bits/s Shielded Twisted Pair, Society of Automotive Engineers, Inc., SAEJ1939/11, Issued Dec. 94.

(List continued on next page.)

*Primary Examiner*—Leslie Pascal
*Assistant Examiner*—Agustin Bello
(74) *Attorney, Agent, or Firm*—Jeffrey P. Calfa; Neil T. Powell; Dennis Kelly Sullivan (57) ABSTRACT

A data transmission system for external use with a controller area network is installed on a motor vehicle undergoing high intensity electromagnetic interference susceptibility testing. The data transmission system includes a fiber optic cable extending from the immediate vicinity of the truck to a site relatively remote to the truck and out of the effective area of the artificially generated electromagnetic interference. An optical/electrical coupler in close proximity to the motor vehicle is connected to the vehicle controller area network to convert messages occurring on the network to optical signals. The connection is provided by an electrical cable constructed of a twisted pair of wires. The optical/electrical coupler is also connected to an end of the fiber optic cable in the vicinity of the truck. A remote data processing device is attached to the remote end of the fiber optic cable by an interface card installed in the remote data processing device. The interface card converts optical signals to controller area network compatible electrical signals for evaluation.

9 Claims, 7 Drawing Sheets

OTHER PUBLICATIONS

Surface Vehicle Recommended Practice, Joint SAE/TMC Electronic Data Interchange Between Microcomputer Systems in Heavy Duty Vehicle Applications, Society of Automotive Engineers Inc., SAEJ1587, Rev Mar. 96.

Surface Vehicle Recommended Practice, Vendor Component Program Data File Interface for OEM Assembly Operations, Societe of Automotive Engineers, Inc., SAEJ2286, Issued Feb. 97.

Surface Vehicle Recommended Practice, Recommended Practice for Serial Control and Communications Vehicle Network—Part 81—Network Agreement, Society of Automotive Engineers, Inc., SAEJ1939-81, Issued Jul. 97.

Surface Vehicle Standard, Vehicle Application Layer, Society of Automotive Engineers, Inc., SAEJ1939/71, Rev May 96.

* cited by examiner

TELEMETRY SYSTEM AND METHOD FOR EMI SUSCEPTIBILITY TESTING OF MOTOR VEHICLES

REFERENCE TO PRIOR APPLICATION

The present application is a continuation in part of Provisional Application No. 60/122,991 for CAN/J1939 Telemetry Probe for EMI Susceptibility Testing filed Mar. 5, 1999.

BACKGROUND OF THE INVENTION

1. Field of the Invention

The present invention relates to vehicle communications networks and more particularly relates to providing a system and method for testing such networks for electromagnetic interference (EMI) susceptibility

2. Description of the Prior Art

Contemporary designs for the control and management of vehicle components increasingly rely on methods derived from computer networking. Digital data is exchanged between component controllers over a common physical layer, such as a twisted shielded pair of wires. Intelligible communication between two or more device controllers among a greater plurality of devices, all occurring over the common physical layer, depends upon the communicating devices being able to discriminate among messages they receive and respond to those messages directed to them. Such methods are well known in the art and are part of the standards which the Society of Automotive Engineers (SAE) has published and continues to publish as part of the SAE J1939 protocol.

The J1939 protocol provides an open protocol and a definition of the performance requirements of the medium of the physical layer, but also allows for development of proprietary protocols. The SAE J1939 protocol is a specialized application of a controlled area network (CAN) and may be readily implemented utilizing commercial integrated circuits such as the C167 Integrated Circuit from Stemens of Germany.

The CAN protocol is an ISO standard (ISO 11898) for serial data communication, particularly aimed at automotive applications. The CAN standard includes a physical layer (including the data bus) and a data-link layer, which define a few different message types, arbitration rules for bus access and methods for fault detection and fault confinement. The physical layer uses differential transmission on a twisted pair wire bus. A non-destructive bitwise arbitration is used to control access to the bus. Messages are small, at most eight bytes, and are protected by checksum error detection. Each message carries a numeric value which controls its priority on the bus and typically also serves as an identification of the contents of the message. CAN offers an error handling scheme that results in retransmission of messages when they are not properly received. CAN also provides means for removing faulty nodes from the bus. CAN further adds the capability of supporting what are termed "higher layer protocols" for standardizing startup procedures including bit rate setting, distributing addresses among participating nodes or kinds of messages, determining the layout of the messages and routines for error handling on the system level.

Digital data communications over serial data paths are an effective technique for reducing the number of dedicated communication paths between the numerous switches, sensors, devices and gauges installed on the vehicles. Multiplexing the signals to and from local controllers and switches promises greater physical simplicity through displacing much of the vehicle wiring harness, reducing manufacturing costs, facilitating vehicle electrical load management, and enhancing system reliability. However, such systems are not immune to electromagnetic interference ("EMI"). The physical layer of the communication network is, in effect, an antenna, which converts electromagnetic radiation into electrical signals on the physical layer. These signals can combine with data pulses in ways that change the values of the data pulses. Changing a single data point (bit) in a data package makes the data package useless to the intended destination, and may even prevent the destination from decoding the signal at all.

The design of vehicles, and of particular interest here, trucks, requires consideration of the EMI susceptibility of the vehicle's communication system. Testing of such systems, as part of the design and development of trucks, is carried out in an intense EMI environment with the truck mounted on rollers so that EMI susceptibility may be determined during operation of the vehicle. The testing environment provides a roller bed for the truck, with the roller bed possibly disposed on a turntable. An EMI source is aimed at the truck. In effect, an objective of the testing is to make the vehicle's communication network as inefficient an antenna as possible. The specifications for the testing are set forth in the SAE Standard J551, parts 11, 12 and 13.

During testing a datalink or telemetry probe is connected into a data bus diagnostic port on the truck, and may be positioned in the truck cab under the steering column. The datalink runs from the port to a location away from the truck, where it is connected to monitoring equipment. These data links have typically been constructed of a twisted pair cable. The external data link is severely limited in length, in large part because the cable acts as an extension of the antenna formed by the physical layer of the truck's network. Because the external cable changes the dimension and length of the antenna, it also changes the susceptibility of the combined system. This can result in additional errors to messages transmitted on the truck's CAN network, or, under some circumstances, it can result in fewer errors than would otherwise occur. In either case the test results are suspect.

Because the external link acts as an antenna itself, or as an extension of the antenna formed by the physical layer of the truck's data network, the external data link distorts the conditions of the test. More accurate direct measurements can be obtained if the affects of the external data link are minimized.

SUMMARY OF THE INVENTION

It is an object of the invention to provide a reliable controller area network communication link in an EMI intensive environment.

It is another object of the invention to provide a test data link into an electrical data communications system which minimizes changes to the EMI susceptibility of a vehicle communications system.

It is a still further object of the invention to provide a CAN based repeater able to simulate a portion of a CAN network.

It is yet another object of the invention to provide extension of the CAN network to a remote location during EMI susceptibility testing.

It is still another object of the invention to provide qualification of a optical interconnection to an electrical controller area network.

According to the invention there is provided a data transmission system for external use with a controller area network installed on a motor vehicle undergoing high intensity electromagnetic interference susceptibility testing. The data transmission system includes a fiber optic cable extending from the immediate vicinity of the truck to a site relatively remote to the truck and out of the effective area of the artificially generated electromagnetic interference. An optical/electrical coupler in close proximity to the motor vehicle is connected to the vehicle controller area network to convert messages occurring on the network to optical signals. The connection is provided by an electrical cable constructed of a twisted pair of wires. The optical/electrical coupler is also connected to an end of the fiber optic cable in the vicinity of the truck. A remote data processing device is attached to the remote end of the fiber optic cable by an interface card installed in the remote data processing device. The interface card converts optical signals to controller area network compatible electrical signals for evaluation.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
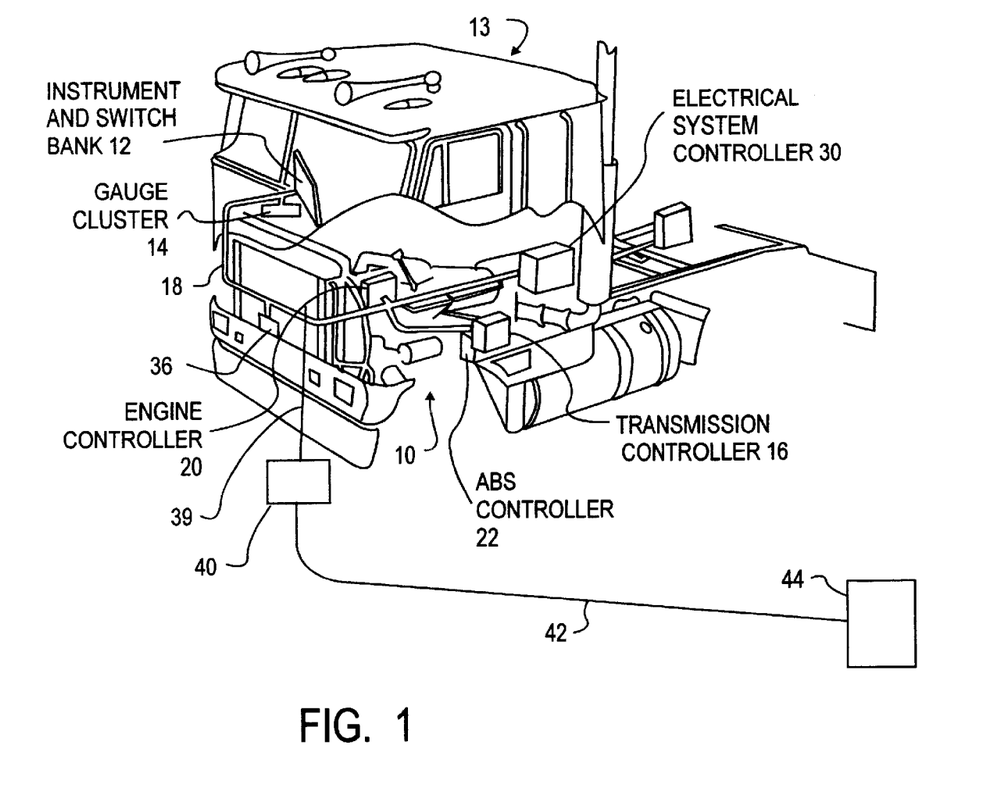
FIG. 1 is an illustration of a vehicle electrical system in a perspective, partial cutaway view of a truck.

FIG. 1 is a perspective view of a vehicle 13 and of an electrical control system 10 installed on the vehicle. Vehicle electrical system 10 comprises a twisted pair (either shielded or unshielded) cable operating as a serial data bus 18. Collectively, bus 18 and the various nodes attached thereto form a controller area network (CAN).

Active vehicle components are typically controlled by one of a group of autonomous, vocational controllers, which include a gauge cluster 14, an engine controller 2,0, a transmission controller 16, an auxiliary instrument and switch bank 12, and an antilock brake system (ABS) controller 22, all of which are nodes on bus 18. The autonomous controllers include local data processing and programming and are typically supplied by the manufacturer of the controlled component. Bus 18 is a twisted pair cable constructed in accordance with SAE standard J1939 and is externally accessible via a diagnostic port 36. Diagnostic port 36 is typically located under the steering column inside the cab of vehicle 13, but may be located elsewhere.

In many applications, the autonomous controllers handle many functions locally, utilizing data received over bus 18 from other controllers. Some CAN networks may include an Electrical System Controller (ESC) 30, in which case they report data to ESC 30 and receive operational requests from ESC 30. When present, ESC 30 manages a number of vocational controllers connected to bus 18 as nodes and disposed on vehicle 13. ESC 30 also executes a load management program which oversees the total load imposed on the vehicle electrical system and power train by various accessories installed on the vehicle.

The loads imposed on vehicle 13 systems controlled by electrical control system 30 are usually electrical loads, however, they may include electronically controlled engagement of mechanical devices to the power train of vehicle 13. Gear selection in an automatic transmission would be an example of such a system. Other electrically controlled nonelectrical loads can include control of a clutch for an air conditioning compressor, or actuation of pumps driven by the vehicle drive train. The load management program can, depending on power demands by components, request increased power output from the engine through engine controller 20.

Gauge cluster 14, transmission controller 16 and engine controller 20 can all communicate with ESC 30, which then monitors inputs received from the auxiliary instrument and switch bank 12 over the serial communication link in harness 18. ESC 30 may be programmed to override the normal response characteristics of the gauge cluster 14, transmission controller 16 and engine controller 20, should electrical and mechanical loads exceed the capacity of the vehicle, should requests conflict with one another, and under other circumstances.

Bus 18, being either a shielded or unshielded twisted pair of wires, can function as an antenna and thus is vulnerable to electromagnetic interference (EMI). Digital data is unlike digitally transmitted voice or music in being relatively vulnerable to electromagnetic interference. Digitally transmitted uncompressed music and voice is relatively immune to EMI because changing a few bits in the stream of digital data does not change enough of the data stream to effect human perception of its auditory reproduction. However, in the typical eight byte message used on a CAN, the change of a single bit destroys the usefulness of the message. Excessive error rates, defined as the increased frequency of messages having any error, particularly where they relate to the critical automotive or truck functions, can be controlled to some extent by a physical disposition of bus 18, or by the substitution of more expensive shielded cable for unshielded cable.

Accordingly, vehicle 13 development preferably includes testing for EMI susceptibility of the CAN network including bus 18 and the nodes attached thereto. Evaluation of the network is done by accessing the network through diagnostic port 36 while exposing the vehicle 13 to EMI. A transmitting antenna 38, positioned externally to the vehicle 13, transmits electromagnetic radiation toward vehicle 13 during testing. The effects of the radiation on network communications are then monitored.

In the prior art, a J1939 compliant cable would be stretched from port 36 to a remote diagnostic computer 44. J1939 cables, being shielded or unshielded twisted wire pairs, are typically electrically indistinguishable from the cable used on the vehicle as bus 18. Thus the diagnostic cable functions as an antenna in the same manner as the vehicle mounted bus 18. The effect can distort the results of testing, either by introducing additional message errors to the network or by reducing the number of errors which are occurring. The effect can be expected to be dependent on the frequencies of the EMI interference since the change introduced to the network cable is one akin to changing the geometry and dimensions of an antenna. The susceptibility of an antenna is a function of electromagnetic frequency. The system of the present invention utilizes an optical link 42 to extend the physical layer of the CAN network to a remote diagnostic computer 44. The physical layer extension includes diagnostic port 36, a short shielded twisted wire pair 39, and a CAN compatible optical coupler unit 40. Wire pair 39 usually connects diagnostic port 36 to coupler unit 40, however, under some circumstances the wire pair is used as a feedback loop into coupler unit 40 for diagnostic purposes. Personal computer 44 is coupled to the data link by a CAN compatible optical/electrical network interface card as described below.

Figure 2:
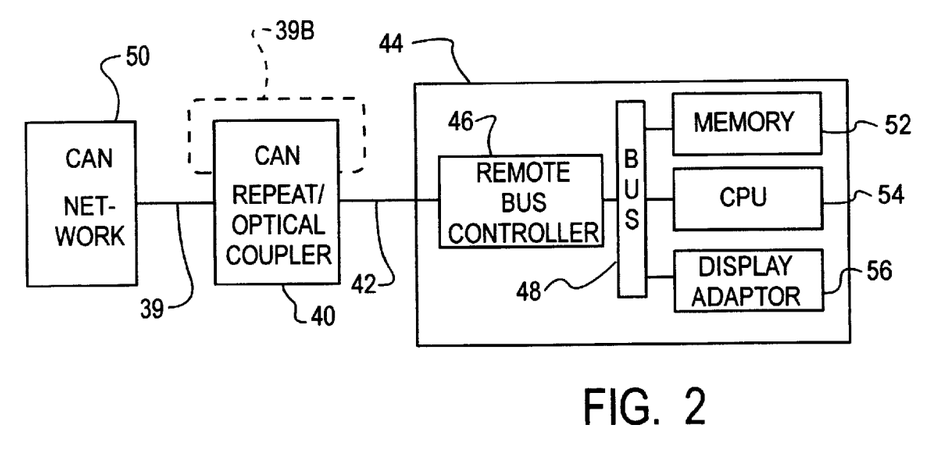
FIG. 2 is a high level block diagram of the invention.

FIG. 2 illustrates a possible topography of the physical layer extension to a vehicle CAN 50 including twisted pair cable 39, optical electrical coupler 40 and optical link 42. Optical link 42 is connected to an adaptor card/remote bus controller 46 connected into an ISA, PCI, or PCMIA bus 48 expansion slot in a personal computer 44 programmed to operate as a diagnostic tool. Personal computer 44 is otherwise conventional stored program computer having a memory 52, a central processing unit 54 and a display adaptor 56. Cable 39B indicates connection of cable 39 in a feedback loop for qualification of optical link 42 and coupler 40.

Figure 3:
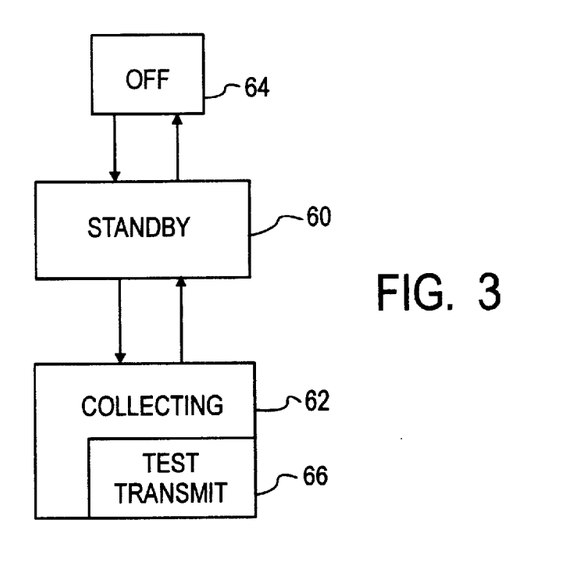
FIG. 3 is a state diagram illustrating the control sequence for the system of the invention.

Computer 44 implements various states illustrated by the state diagram of FIG. 3. The system operates in two modes, standby 60 and data collecting 62. There is of course the non-operational "OFF" mode 64, where the test regimen installed on computer 44 is not operating. On transition from off mode 64 to standby mode 60, various hardware interfaces are initialized. In standby mode 60 no data is collected from CAN bus 18. From standby mode 60 the system can return to off mode 64, or it can move to data collecting mode 62.

Within standby mode 60 interactions are allowed with an operator through a conventional graphical user interface program written to one of the Windows application program interfaces and conventionally implemented through peripheral devices (e.g. CRTs, keyboards, pucks (not shown)) attached to computer 44. The user may interact with system configuration, specification of descriptive information that is stored for each test, instructing the computer to move to collecting mode 62 (i.e. starting a new test), handling the results from previous tests, and instructing the system to move to off mode 64. Configuration information, which may be entered during standby mode 60, includes data required to specify the CAN interface hardware characteristics, including for example, interrupt number and input/output address. In addition, default thresholds for error detection rates, default values for moving window periods for error rate calculations and default information for general annotations must be entered.

All configuration information is stored in configuration initialization files used on instrument initialization. An initialization file is used on transition from off mode 64 to standby mode 62. At that time available memory and hard drive space are checked to confirm sufficient computer 44 resources to carry out the test. Inadequate resources does not prevent test operation but does cause issuance of a warning to the user. The configuration file(s) is(are) read to establish the initial configuration, subject to user changes.

Within the data collecting mode 62 the system collects data from the CAN bus 18. Personal computer 44 provides near real time display of the results of the test in progress, including the results for particular and overall error monitoring, message transfer rates, the current status of CAN bus 18 and any change in bus 18 status. User interactions are allowed relating to control of transition of the system from collection mode 62 to standby mode 60, modifications of thresholds used to detect error rates, the control of error detection latches and to permit annotation of a test in progress, including: (1) notes about the test; (2) control of the event counter; and (3) notation of input field strength and frequency.

Additionally, there is a test transmit mode 66 which may be active within collecting mode 62. Test transmit mode 66 supports transmission of a user specified message list at a user specified interval. This provides the system with the ability to qualify itself for both transmitting and receiving messages in the high EMI environment. This operational mode also allows the user to issue requests to particular CAN nodes during vehicle tests to cause the node to receive and transmit during the test.

The test regimen implemented by computer 44 includes the use of CAN bus error detection of several types. Explanation of the test regimens is aided by explanation of some operations of CAN 50. Every transmitted message on CAN 50 includes a 16 bit Cyclic Redundancy Check (CRC) code. The CRC is computed by the transmitting node and is generated from the message content. The test process accumulates the number of CRC errors which occur during the collection mode 62. The accumulation count may be executed by computer 44's CAN interface and may be aggregated with other errors. Other error mode detection regimens exist, such as bit stuffing. Detection of a bit stuffing error results in CAN resynchronization.

There are certain predefined bit values that must be transmitted in certain locations of any CAN message. If a receiving node detects an invalid bit at one of these positions a Format error is flagged by the receiver. The number of format errors occurring during collection mode 62 is tabulated for comparison to a limit. Another error type monitored is the acknowledge (ACK) error which is flagged by a transmitting node. In addition, the actual bit level is monitored during collecting mode.

Bit stuffing has already been mentioned. The bit stuffing protocol requires that whenever five consecutive bit levels of like polarity have transmitted, a transmitter automatically injects (stuffs) a bit of opposite polarity into the bit stream. Receivers automatically delete such bits before processing messages. A receiving node that detects six consecutive bits of the same value flags a stuff error. The occurrence of such errors is monitored. Error performance data about the CAN bus 18 is aggregated in the form of either loss of synchronization or a low message rate.

The test data displayed includes: time; event counter; message error rates; message success rates; bus state (active/passive/off); zero error count to non-zero error count transitions; current pass/fail status for each observed error rate; latched pass/fail status and the ability to reset pass/fail latches.

Figure 4:
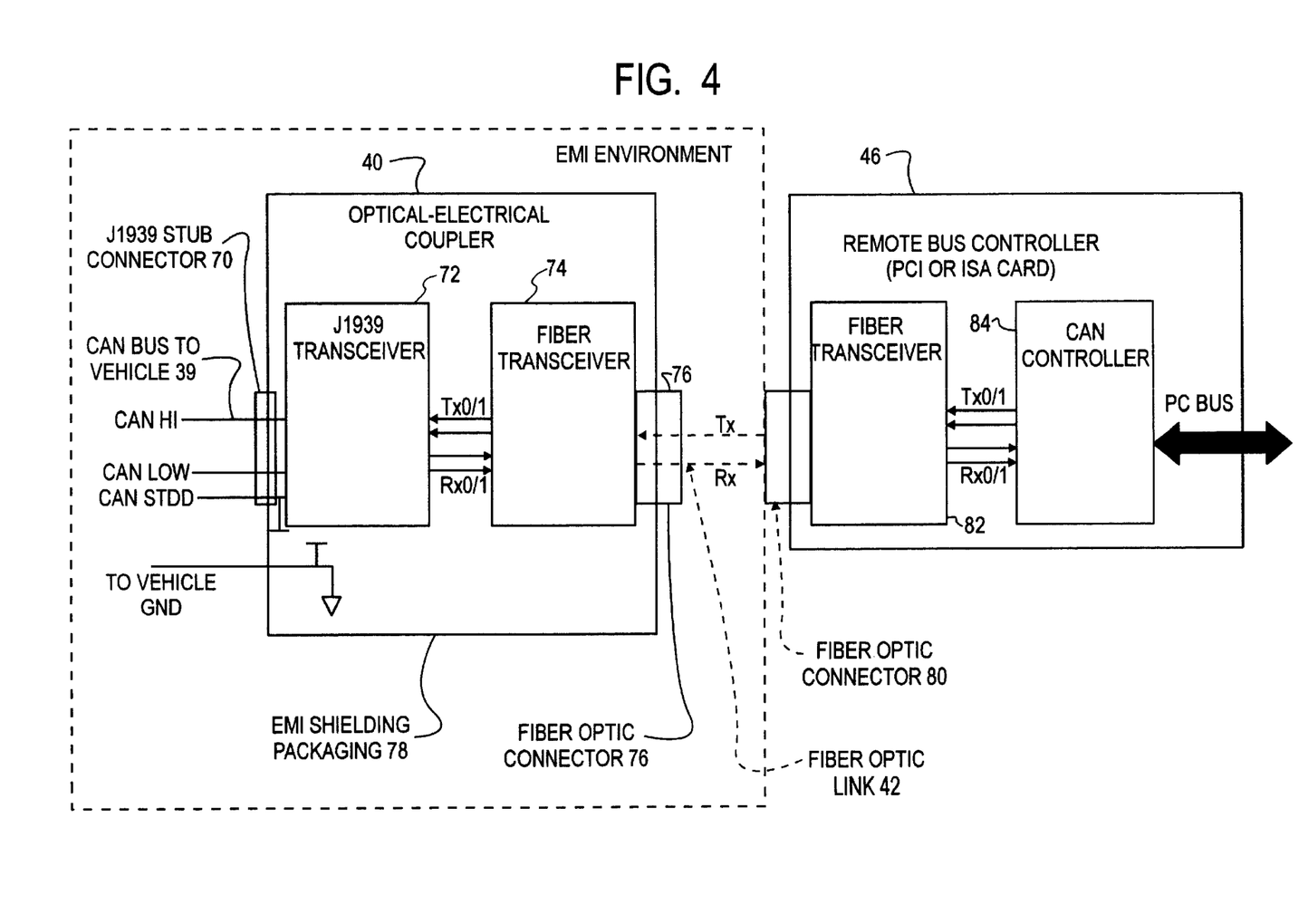
FIG. 4 is a detailed block diagram of an optical electric coupler used with the system of the invention.

FIG. 4 is a block diagram of the major functional blocks of the optical-electrical coupler 40 and remote bus controller 46 used in implementing the present invention. The system of the present invention allows a CAN bus to be extended to a remote location, here the location of personal computer 44, without effecting the results of EMI susceptibility testing of the CAN bus. A field unit, provided by optical to electrical coupler 40, must be operable in close proximity to vehicle 13, and is preferably located within 2 meters of diagnostic port 36. Optical-electrical coupler 40 is typically coupled to CAN bus 18 via a CAN compatible, twisted pair cable 39 connected between a J1939 stub connector 70 and diagnostic port 36. Internally optical-electrical coupler 40 comprises a J1939 transceiver 72 for converting CAN messages to a pulse sequence for actuating light emitting diodes (part of fiber transceiver 74). The LEDs and photosensitive elements of fiber transceiver 74 are positioned in a fiber optic connector 76 for coupling light pulses onto a fiber optic link 42. The two way transmission of data may extend out to 40 meters, with 35 meters being exposed to the EMI intense environment, without bit timing problems. Greater one way transmission lengths are possible. Optical-electrical coupler is shielded 78 against EMI and is preferably electrically independent of the vehicle 13.

Fiber optic link 42 is connected at one end to fiber optic connector 76 on optical electrical connector 40 and at its other end to a fiber optic connector on a remote bus controller card 46 installed in a convention personal computer. The remote bus controller card 46 has a fiber transceiver 82 directly connected to fiber optic connector 80. Fiber transceiver 82 communicates with a CAN controller unit 84 which in turn communicates over any selected standard, contemporary PC bus including an ISA bus, a PCI bus, or a PCMCIA bus.

Figure 5:
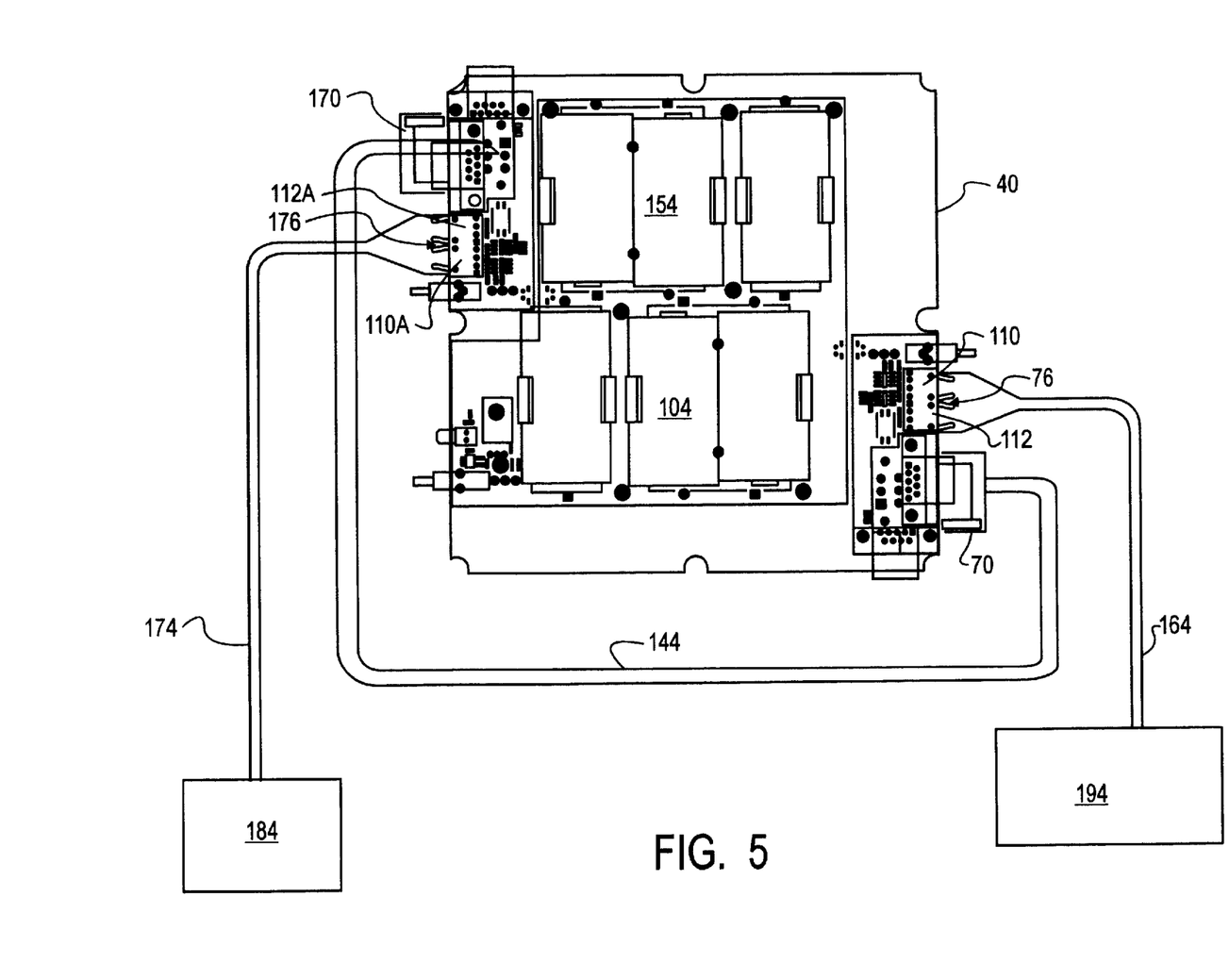
FIG. 5 is a plan view of an optical electrical coupler connected and a test regimen topography.

FIG. 5 illustrates the interconnection topography of two fiber optic transceiver channels 104 and 154 contained within an optical electrical connector 40. In the test topography two independent remote bus controllers 184 and 194, which are preferably installed on independent test bed personal computers, but which may be installed on the same personal computer. Remote bus controller 184 is connected by a fiber optic link 174 to receive signals transmitted by LED 110A, or to transmit signals to photosensitive receiving element 112A, in a fiber optic connector 170. Remote bus controller 194 is similarly connected by a fiber optic link 164 to an fiber optic connector 76, which in turn includes a transmitting element 112 and a receiving element 110 in connector 70. Signals may be transmitted or received over fiber optic link 164. Channels 154 and 104 are electrically connected a J1939 compliant twisted pair cable 144. Optical signals applied to either channel 154 or channel 104 are passed by the receiving channel as electrical signals over cable 144 to the non-receiving channel for retransmission as optical signals. Thus complete testing of the unit is possible. The differentiated channels also have the ability to receive their own messages and to verify circuitry from controllers out to the linkages. The possibility of false indications of correct operation are thus limited.

Figure 6A:
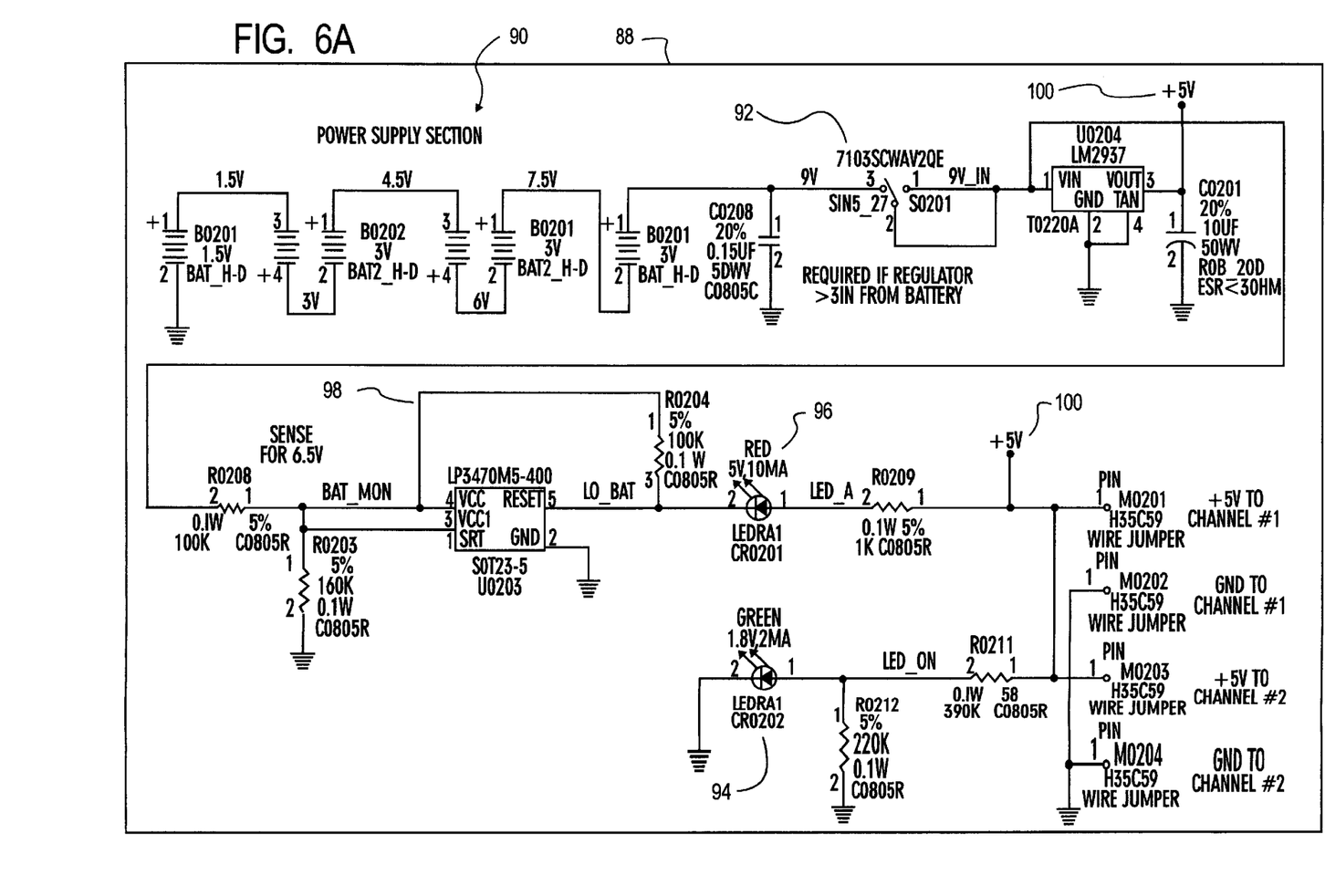
FIGS. 6A–6C is a detailed circuit schematic of one channel of the optical electric coupler of FIGS. 4 and 5.
Figure 6B:
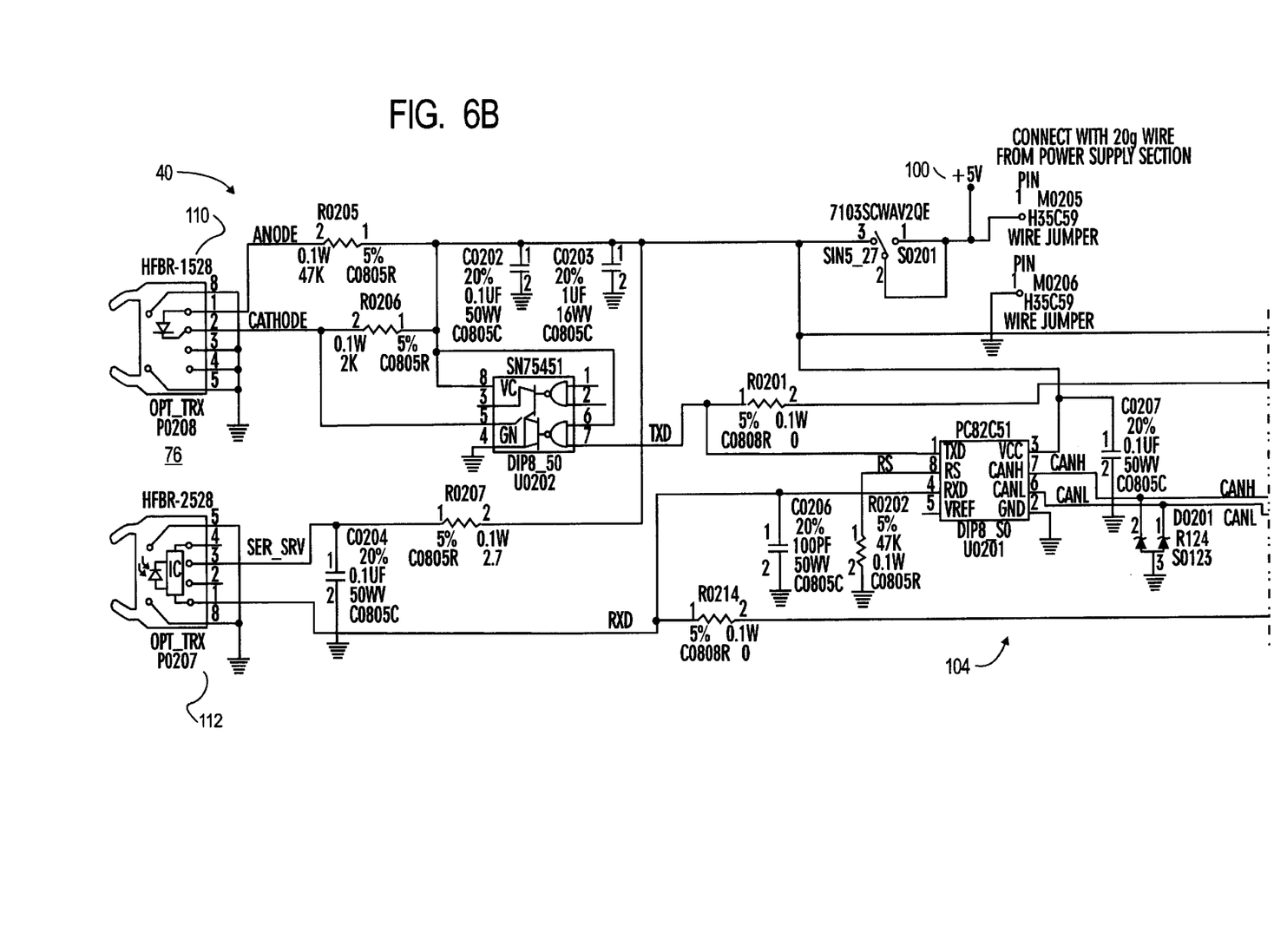
Figure 6C:
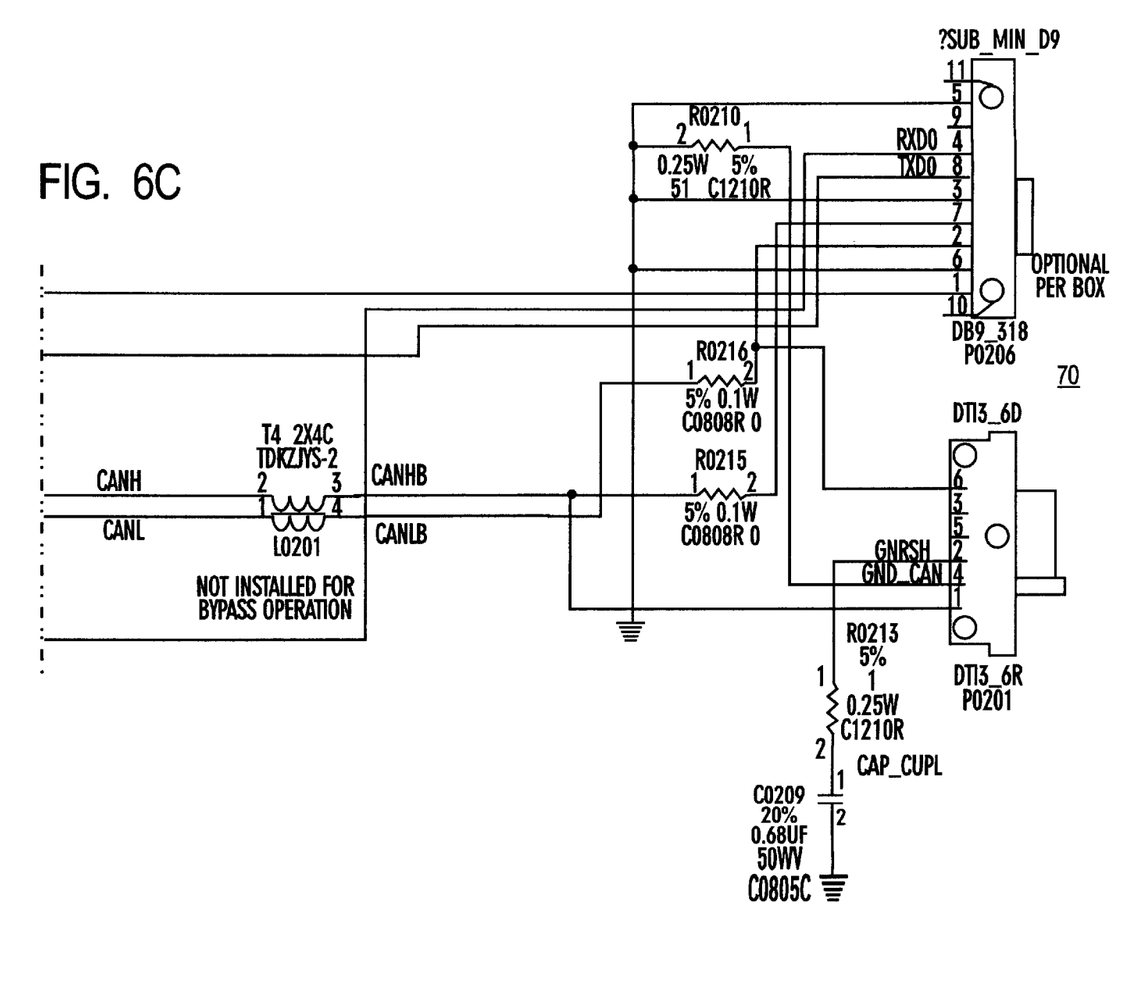

FIG. 6 is a detailed circuit schematic for a preferred embodiment of optical-electrical coupler 40, illustrating one fiber optic channel 104 and a power supply 90. A second fiber optic channel is deleted for the sake of clarity. Electrical isolation of coupler 40 from the power system of the CAN network being monitored is conventionally provided by a power supply section 88 using six commercial 1.5 volt batteries connected in series as a pack 90. Coupler 40 is actuable by a simple hard switch 92 connected in series with the battery pack 90. A five volt supply 100 is supported by pack 90 via a regulator section 102 from the maximum raw 9.0 volt supply supported by a fresh pack 90. An "ON" indication is provided by illumination of a green LED 94 mounted in the exterior shielding 78 of the coupler 40. This occurs when the positive output voltage on "channel 2" is sufficiently high. A low power indication is supplied by illumination of a red LED 96, which is located in a sense section 98. LED 96 passes current in response to a drop of voltage of the raw supply voltage to below a minimum required level.

A fiber optic channel transceiver section 104 includes J1939 stub connector 70. Transceiver section 104 includes a LED 110 and a photosensitive element 112. The circuitry is conventional for changing the format of the messages from or to CAN standards.

The invention provide a reliable controller area network communication link to a remote location in an EMI intensive environment. The communication link, being optical, does not affect the EMI susceptibility of an electrical communications system undergoing testing. The link itself is readily qualified for use in a particular EMI environment.

While the invention is shown in only one of its forms, it is not thus limited but is susceptible to various changes and modifications without departing from the spirit and scope of the invention.

What is claimed is:

1. An electro-optical network extension for use with a controller area network installed on a motor vehicle allowing accurate testing of data error occurrences during high intensity electromagnetic interference susceptibility testing, the electro-optical network extension comprising:

an optical/electrical coupler in close proximity to the motor vehicle;

an electrical cable connected between the optical/electrical coupler and the controller area network;

a data processing device located outside of the area of high intensity electromagnetic interference;

a network controller and interface installed on the remote data processing device for converting optical signals to controller area network compatible electrical signals and evaluating error rates for data signals on the controller area network; and a fiber optic cable connected between the optical/electrical coupler and the network controller and interface.

2. An electro-optical network extension as set forth in claim 1, wherein the optical/electrical coupler is shielded against electromagnetic interference.

3. An electro-optical network extension as set forth in claim 2, wherein the optical/electrical coupler includes:

means for converting optical signals received over the fiber optic cable to electrical signals; and means for converting electrical signals to optical signals and transmitting the optical signals onto the fiber optic cable.

4. An electro-optical network extension as set forth in claim 2, wherein the optical/electrical coupler includes first and second channels, each channel having an electrical connector for connection to an electrical cable and a two-way optical connector.

5. An electro-optical network extension as set forth in claim 4, and further comprising:

an electrical cable coupling the electrical connector for the first channel and the electrical connector for the second channel;

the fiber optic cable connecting the two-way optical connector for the first channel to the remote data processing unit; and a second fiber optic cable connecting the two-way optical connector for the second channel to a second remote data processing unit.

6. Apparatus for evaluating error rates occurring in digital traffic on a vehicle controller area network, the apparatus comprising:

an electromagnetic interference test area;

an electro-optical coupler within the electromagnetic interference test area having a fiber optic cable connector for receiving and transmitting optical signals, and an electrical connector;

a twisted pair electrical cable connected at one end to the electrical connector of the electro-optical coupler and at the other end to vehicle controller area network for coupling data to an from the vehicle controller area network;

a computer outside of the electromagnetic test area having an electro-optical transceiver and a controller area network controller for evaluating error rates in data streams; and an optical cable connected between the electro-optical coupler and the interface of the computer.

7. Apparatus as claimed in claim 6, further comprising:

the electromagnetic test area allows the vehicle to be running.

8. Apparatus as claimed in claim 6, wherein the error threshold is selectable.

9. Apparatus as claimed in claim 8, wherein the electro-optical coupler has a second fiber optic cable connector for receiving and transmitting optical signals, and a second electrical connector, allowing a feedback qualification loop connection between the first and second electrical connectors.

* * * * *